US008115473B2

(12) United States Patent
Sato et al.

(10) Patent No.: US 8,115,473 B2
(45) Date of Patent: Feb. 14, 2012

(54) OPTICAL VOLTAGE TRANSFORMER

(75) Inventors: Junichi Sato, Kunitachi (JP); Masao Takahashi, Fujisawa (JP); Miwa Takeuchi, Kuwana (JP); Teruhiko Maeda, Yatomi (JP); Mitsuhiro Fujikawa, Yokohama (JP); Tokihiro Umemura, Inabe-gun (JP); Tsuyoshi Kuwabara, Yokkaichi (JP)

(73) Assignees: Kabushiki Kaisha Toshiba, Tokyo (JP); Toshiba Industrial Products Manufacturing Corporation, Mie-gun (JP)

( * ) Notice: Subject to any disclaimer, the term of this patent is extended or adjusted under 35 U.S.C. 154(b) by 258 days.

(21) Appl. No.: 12/596,065

(22) PCT Filed: Apr. 7, 2008

(86) PCT No.: PCT/JP2008/056870
§ 371 (c)(1),
(2), (4) Date: Dec. 22, 2009

(87) PCT Pub. No.: WO2008/132974
PCT Pub. Date: Nov. 6, 2008

(65) Prior Publication Data
US 2010/0109642 A1 May 6, 2010

(30) Foreign Application Priority Data
Apr. 18, 2007 (JP) .................. 2007-109592

(51) Int. Cl.
*G01R 31/00* (2006.01)
*G01R 15/18* (2006.01)
*G01R 1/20* (2006.01)

(52) U.S. Cl. ................ 324/96; 324/126; 324/127

(58) Field of Classification Search .............. 324/117 R, 324/117 H, 126, 127, 141–142, 96, 244.1, 324/107; 359/245, 240; 250/355
See application file for complete search history.

(56) References Cited

U.S. PATENT DOCUMENTS
3,466,541 A * 9/1969 Pelenc et al. ................ 324/96
(Continued)

FOREIGN PATENT DOCUMENTS
CN 1412567 A 4/2003
(Continued)

OTHER PUBLICATIONS
Office Action (with English translation) issued on Aug. 25, 2011, in counterpart Chinese Application No. 200880012156.4 (11 pages).

*Primary Examiner* — Huy Q Phan
*Assistant Examiner* — Tung X. Nguyen
(74) *Attorney, Agent, or Firm* — Oblon, Spivak, McClelland, Maier & Neustadt, L.L.P.

(57) ABSTRACT

An optical voltage transformer is connected with an external electric device and includes a primary electrode to which a measured voltage is applied by the external electric device, a first secondary electrode provided oppositely to the primary electrode, an insulation layer provided between the primary and first secondary electrodes and constituting an insulation cylinder integrally formed with the primary and first secondary electrodes, a ground layer provided on an outer circumference of the insulation cylinder and around the first secondary electrode for securing a capacitance by interposing the insulation layer between the ground layer and the first secondary electrode, and an electro-optic element for measuring a voltage between the first secondary electrode and the ground layer. According to the optical voltage transformer, measurement of the measured voltage can be done with high accuracy without affected by its surrounding environment and its downsizing can be achieved by reducing the number of its components.

7 Claims, 2 Drawing Sheets

U.S. PATENT DOCUMENTS 5,128,608 A * 7/1992 Ochi ............................... 324/96

FOREIGN PATENT DOCUMENTS

| | | |
|---|---|---|
| JP | 3 235064 | 10/1991 |
| JP | 5 93743 | 4/1993 |
| JP | 7 83961 | 3/1995 |
| JP | 7 311222 | 11/1995 |
| JP | 11 202000 | 7/1999 |
| JP | 2003 333715 | 11/2003 |

* cited by examiner

OPTICAL VOLTAGE TRANSFORMER

TECHNICAL FIELD

The present invention relates to an optical voltage sensor for measuring main circuit voltage in an electric device, such as a switchgear, using an electro-optic effect (Pockels effect), i.e., an optical voltage transformer.

BACKGROUND ART

In an electric device such as a switchgear, a wire-wound type voltage transformer is used for protecting a main circuit or measuring in the main circuit. Recently, an optical voltage transformer that provides advantages, such as anti-inductance, broad spectrum and electric insulation, is widely used.

As this sort of an optical voltage transformer, known is an optical voltage transformer that includes a main circuit section filled with insulation gas, a voltage dividing capacitor connected with the main circuit section, and an optical sensor with electro-optic element. An optical potential transducer disclosed in a Patent Document 1 shown below is an equivalent device to an optical voltage transformer. The optical potential transducer includes a voltage divider for dividing voltage to be measured, and an optical sensor for transducing an output voltage from the voltage divider into optical intensity corresponding to the output voltage by applying the output voltage to an electro-optic crystal. The voltage divider in the optical potential transducer is composed of a voltage divider main section, as a gas capacitor, that is composed of a charged portion to which the measured voltage is applied, a single void electrode surrounding the charged portion and insulation media, and a solid capacitor connected with the void electrode and the optical sensor.

Since the divider main section is composed only of the gas capacitor at the high-tension side and electrical capacity at the low-tension side is ensured by the solid capacitor, a most-outer void electrode that was previously needed can be omitted and thereby downsizing and weight-saving of the voltage divider can be achieved.

In addition, an optical voltage transformer disclosed in a Patent Document 2 shown below includes a main circuit section that has a ceramic capacitor instead of insulation gas, another ceramic capacitor connected with the main circuit section for dividing voltage, and an optical sensor having an electro-optic element. These components are integrally molded to be surrounded with an insulation layer.

According to the optical voltage transformer, since the capacitor for dividing voltage and the optical sensor are integrally molded with the insulation material, downsizing can be achieved and its handling upon being attached onto a conductor to be measured can be easy.

Patent Document 1: Japanese Patent Application Laid-open No. Hei 7-83961
Patent Document 2: Japanese Patent Application Laid-open No. Hei 11-202000

DISCLOSURE OF THE INVENTION

However, the above-mentioned optical transformer using insulation gas in the main circuit section needs to ensure a certain insulation distance according to dielectric strength of the insulation gas and thus its downsizing is limited. In addition, the optical transformer using the ceramic capacitors needs the certain number of tandem alignments according to dielectric strength of the capacitors and thus its downsizing is limited. Namely, in these optical voltage transformers, the main circuit section for generating main circuit voltage may become large.

Further, these optical voltage transformers need ancillary components such as capacitors for dividing voltage and thus the number of components may increase. Furthermore, if media used for dividing of the main circuit voltage is varied, a designer and an operator thereof must pay attention to fluctuation of dividing voltage ratio due to surrounding environment such as temperature change. Therefore, excessive works for its adjustment must be needed.

This goes against recent trends of downsizing. Therefore, desired has been an optical voltage transformer that can achieve shorter insulating distance than that with insulation gas or ceramic capacitors and can reduce its cost and the number of its components.

It is an object of the present invention to provide an optical voltage transformer that can prevent its measurement accuracy from being affected by its surrounding environment such as temperature alteration and can achieve its downsizing by reducing the number of its components.

An aspect of the present invention provides an optical voltage transformer that includes a primary electrode connected with an external electric device, to which a measured voltage is applied by the external electric device; a first secondary electrode provided oppositely to the primary electrode; an insulation layer that is provided between the primary electrode and the first secondary electrode and constitutes an insulation cylinder integrally formed with the primary electrode and the first secondary electrode; a ground layer that is provided on an outer circumference of the insulation cylinder and around the first secondary electrode and secures a capacitance by interposing the insulation layer between the ground layer and the first secondary electrode; and an electro-optic element for measuring a voltage between the first secondary electrode and the ground layer.

According to the above aspect, the optical voltage transformer can achieve accurate measurement without affected by its surrounding environment such as temperature alteration and can achieve its downsizing by reducing the number of its components.

BEST MODE(S) FOR CARRYING OUT THE INVENTION

Figure 1:
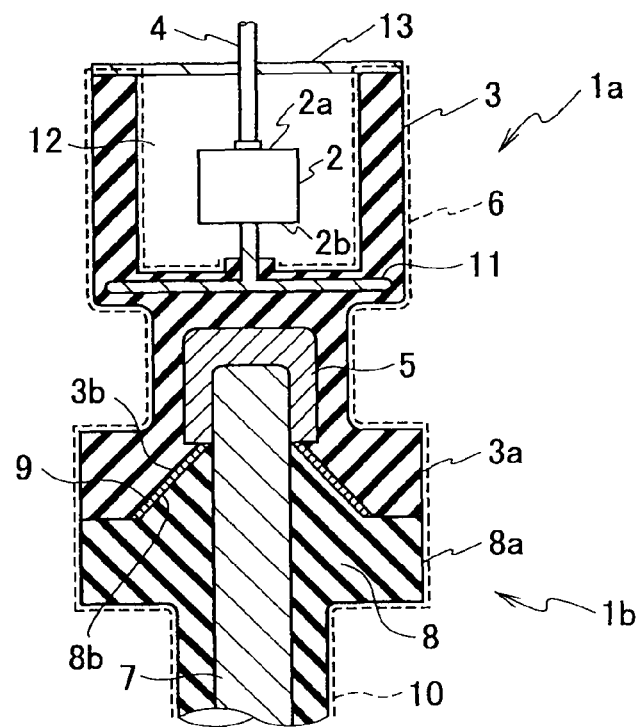
[FIG. 1] It is a cross-sectional drawing showing an optical voltage transformer according to a first embodiment of the present invention.

An optical voltage transformer according to a first embodiment of the present invention will be explained with reference to the drawings. As shown in FIG. 1, the optical voltage transformer is a voltage detector $1a$ composed of a primary electrode 5, a secondary electrode 11, an insulation layer 3, a ground layer 6, an electro-optic element 2, and a soft insulator 9. The optical voltage transformer is connected with an external electric device (e.g., a switchgear) via a main circuit device 1b.

The primary electrode 5 is connected with the external electric device and measured voltage is applied thereto by the external electric device. The primary electrode 5 is a cup-shaped electrode and electrically connected with a center conductor 7 of the main circuit device 1b.

The secondary electrode (first secondary electrode) 11 is opposed to the primary electrode 5 with interposing the insulation layer 3 to keep a predefined insulating distance.

The insulation layer 3 is provided between the primary electrode 5 and the secondary electrode 11. The insulation layer 3 is integrally formed with the primary electrode 5 and the secondary electrode 11 being inserted. The insulation layer 3 constitutes an insulation cylinder. The insulation layer 3 is made of epoxy resin. A tapered recess is formed on a flange 3a provided at an end of the insulation cylinder of the insulation layer 3, as shown in FIG. 1. A recess of the primary electrode 5 is exposed at the center of the tapered recess.

The ground layer 6 is provided on the outer circumference of the insulation cylinder of the insulation layer 3 and around the secondary electrode 11. Electrically-conductive coating is coated on the ground layer 6. The ground layer 6 has a predefined capacitance by interposing the insulation layer 3 between itself and the secondary electrode 11. Note that the ground layer 6 is electrically contacted with a ground layer 10 of the main circuit device 1b upon being assembled with the main circuit device 1b of the voltage detector 1a to keep the ground potential.

The electro-optic element 2 is a columnar Pockels element made of BGO ($Bi_4Ge_3O_{12}$) crystal or BSO ($Bi_{12}SiO_{20}$) crystal for measuring the voltage between the secondary electrode 11 and the ground layer 6. The electro-optic element 2 has a characteristic of varying refringence of an input light according to electrical field intensity. In addition, an optical cable 4 is connected to one end of the electro-optic element 2. The electro-optic element 2 has evaporated metallic films 2a and 2b on its surfaces perpendicular to its axis that are made of metal such as aluminum. The evaporated metallic film 2b is provided on the surface of the electro-optic element 2 that is opposed to the secondary electrode 11. The evaporated metallic film 2b is electrically connected with the secondary electrode 11. On the other hand, the evaporated metallic film 2a is formed on the surface of the electro-optic element 2 that is connected with the optical cable 4 with avoiding the optical cable 4. The evaporated metallic film 2a is electrically connected with the ground layer 6. The evaporated metallic films 2a and 2b generates electrical field distribution parallelly in the electro-optic element 2. Therefore, the electro-optic element 2 achieves high-accuracy voltage measurement with keeping refringence of light stably.

The insulation cylinder includes a cavity 12 for housing the electro-optic element 2. The cavity 12 is sealed by the insulation layer 3 and a cover 13. Therefore, prevented are characteristic changes of the electro-optic element 2 due to defacement, wetting or the like. In addition, the ground layer 6 is provided on the inner surface of the cavity 12. A designer can make the capacitance between the secondary electrode 11 and the ground layer 6 large by providing the ground layer 6 in this manner. Measured voltage to be applied to the primary electrode 5 is divided by the secondary electrode 11 and the ground layer 6. The dividing voltage ratio is determined due to the capacitance between the primary electrode 5 and the secondary electrode 11 and the capacitance between the secondary electrode 11 and the ground layer 6. Therefore, a designer needs to make the capacitance between the secondary electrode 11 and the ground layer 6 large in order to reduce the voltage applied to the secondary electrode 11.

In addition, an opening of the tapered recess is formed in the insulation cylinder, as explained above. The opening is connected with the electric device. An exposed plane of the insulation layer 3 at the opening (an tapered plane of the insulation layer 3) is a boundary face 3b that is connected with the electric device. The boundary face 3b is closely contacted with a boundary face 8b of the electric device (an end surface of an insulation layer 8) with interposing the soft insulator 9 made of silicone rubber or the like therebetween.

Note that the insulation layer 3 in the present embodiment is made of epoxy resign but it may be made of insulating soft material such as silicone rubber. In this case, it is not needed to provide the soft insulator 9 on the boundary face 3b.

The main circuit device 1b includes the center conductor 7 connected with a main circuit of the switchgear, the insulation layer 8, and the ground layer 10.

The center conductor 7 conducts the measured voltage of the electrical device such as the switchgear to the primary electrode 5.

The insulation layer 8 is formed by molding insulating material such as epoxy resign around the center conductor 7. As shown in FIG. 1, a tapered bulge is formed on a flange 8a at an end of the insulation layer 8. An end of the center conductor 7 is exposed at the center of the bulge. The tapered surface of the insulation layer 8 is the boundary face 8b.

The ground layer 10 is provided on an outer circumference of the insulation layer 8. Electrically-conductive coating is coated on the ground layer 10. The ground layer 10 keeps the ground potential.

Next, functions of the optical voltage transformer according to the present embodiment configured as above will be explained. First, the voltage detector 1a is connected with external electric device (e.g., the switchgear) via the main circuit device 1b. Here, the boundary face 3b is closely contacted with the boundary face 8b with interposing the soft insulator 9 therebetween. In other words, the soft insulator 9 prevents insulation breakdown due to gaps between the boundary faces 3b and 8b.

In addition, the end of the center conductor 7 is connected with the center recess of the primary electrode 5. Further, the ground layer 6 is electrically contacted with the ground layer 10 of the main circuit device 1b to keep the ground potential, as explained above.

The flanges 3a and 8a are firmly fixed each other with bolts (not shown) by a user.

The measured voltage applied to the primary electrode 5 is divided due to the main-circuit-side capacitance between the primary electrode 5 and the secondary electrode 11 and the ground-side capacitance between the secondary electrode 11 and the ground layer 6. The divided voltage between the secondary electrode 11 and the ground layer 6 is applied to the electro-optic element 2 via the evaporated metallic films 2a and 2b to generate electrical field according to the voltage in the electro-optic element 2.

An external measurement circuit (not shown) inputs light into the electro-optic element 2 through the optical cable 4. The electro-optic element 2 makes the input light polarized according to the electrical field intensity and outputs it to the measurement circuit. The external measurement circuit can measure the voltage between the secondary electrode 11 and the ground layer 6 based on the phase difference of the light from the electro-optic element 2.

Here, the main-circuit-side capacitance and the ground-side capacitance are uniquely-determined due to the primary electrode 5, the secondary electrode 11, and the ground layer 6 surrounding them. The main-circuit-side capacitance and the ground-side capacitance are not affected by other disturbances such as a stray capacitance. Therefore, the measured voltage applied to the primary electrode 5 is divided with extremely great precision due to the main-circuit-side capacitance and the ground-side capacitance.

Hence, the external measurement circuit can measure the measured voltage applied to the primary electrode 5 with high accuracy based on the measured voltage between the secondary electrode 11 and the ground layer 6 and the dividing voltage ratio.

Note that the electro-optic element 2 shown in the FIG. 1 is a reflective type that reflects back the input light from the optical cable 4 attached its one end to the optical cable 4. However, the electro-optic element 2 may be a pass-through type that includes optical cables connected its both ends and outputs an input light from its one end to its other end.

In addition, the insulation layer 3 to secure the main-circuit-side capacitance and the ground-side capacitance is composed of an identical material. Therefore, the main-circuit-side capacitance and the ground-side capacitance may vary in similar manner according to temperature change and humidity change. Since the varied deflection is compensated due to the capacitance ratio, the measured voltage applied to the primary electrode 5 can be divided with extremely great precision. As a result, the external measurement circuit can measure the measured voltage applied to the primary electrode 5 with high accuracy.

Note that the electro-optic element 2 connected between the secondary electrode 11 and the ground layer 6 has capacitance by itself. Making the ground-side capacitance between the secondary electrode 11 and the ground layer 6 five times as large as the capacitance of the electro-optic element 2, the ground-side capacitance cannot be affected by the capacitance of the electro-optic element 2 that may vary according to temperature change and humidity change. As a result, the external measurement circuit can measure the measured voltage applied to the primary electrode 5 with high accuracy.

In addition, the insulation layer 3 made of epoxy resign or the like generally has dielectric strength of 30 kV/mm. Dielectric strength of conventionally used insulation gas is 8 kV/mm and that of conventionally used ceramic capacitors is 5 kV/mm. Since the dielectric strength of the insulation layer 3 is extremely superior to the conventional ones, the voltage detector 1a can be downsized.

According to the optical voltage transformer in the present embodiment, since the main-circuit-side capacitance and the ground-side capacitance can be controlled by the above-described primary electrode 5 and the above-described secondary electrode 11 to control the electrical field of the electro-optic element 2, there is no need to provide a conventional dividing circuit separately. As a result, the number of components can be reduced and thereby the apparatus can be downsized.

Further, since the dielectric strength of the insulation layer 3 composed of the epoxy resign or the like is extremely superior to the dielectric strength of conventionally used insulation gas or ceramic capacitors, the distance between the primary electrode 5 and the secondary electrode, the distance between the secondary electrode 11 and the ground layer 6, and the overall shape can be made small. Thus, the apparatus can be downsized.

Further, since the ground layer 6 is provided on the outer circumference of the insulation cylinder constituted by the insulation layer 3, the apparatus cannot be affected by the external electrical field. As a result, the measured voltage can be measured with high accuracy and high sensitivity.

Further, since the primary electrode 5 and the secondary electrode 11 connected with the electro-optic element 2 are integrally formed with the insulation layer 3, the main-circuit-side capacitance and the ground-side capacitance may vary in similar manner according to temperature change and humidity change. Therefore, accurate measurement can be achieved by the optical voltage transformer according to the present embodiment without affected by surrounding environment such as temperature change.

Note that the ground-side capacitance needs to be made large in order to reduce the voltage of the secondary electrode 11, but the capacitance cannot be made large with conventionally used insulation gas. Therefore, a conventional optical voltage transformer using insulation gas cannot adopt a configuration in which a dividing circuit to secure the main-circuit-side capacitance and a dividing circuit to secure the ground-side capacitance are integrated. From this aspect, advantages of downsizing due to the reduction of the number of components are remarkable.

Further, since the soft insulator 9 is provided, prevented can be the insulation breakdown due to the gaps between the boundary faces 3b and 8b.

Further, since the electro-optic element 2 is housed within the sealed cavity 12, prevented are characteristic changes of the electro-optic element 2 due to defacement, wetting or the like.

Further, since flexibility for controlling the ground-side capacitance can be further expanded by providing the ground layer 6 on the inner surface of the cavity 12, the electrical field of the electro-optic element 2 can be controlled effectively.

Figure 2:
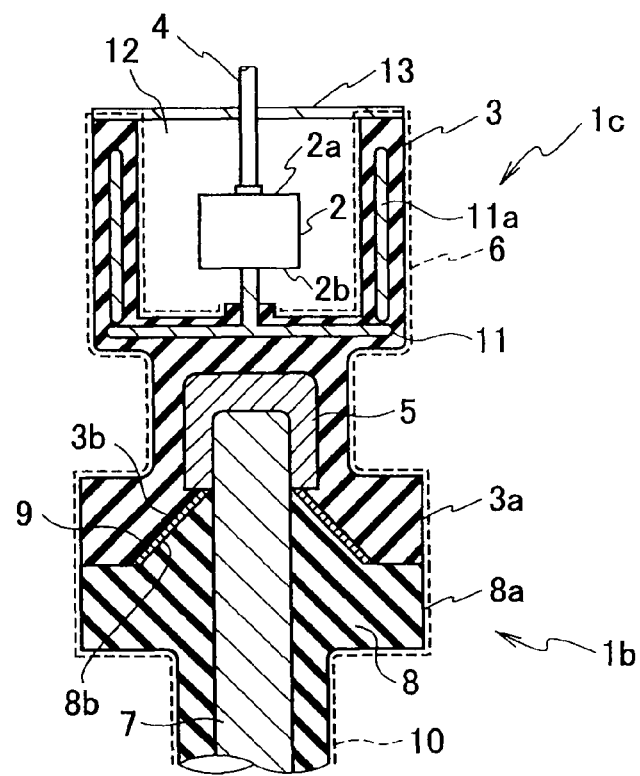
[FIG. 2] It is a cross-sectional drawing showing an optical voltage transformer according to a second embodiment of the present invention.

Next, an optical voltage transformer according to a second embodiment will be explained with reference to FIG. 2. As shown in FIG. 2, a presence of another secondary electrode 11a is different from the above-explained first embodiment.

The secondary electrode (second secondary electrode) 11a is embedded in the insulation layer 3 to surround the cavity 12. The secondary electrodes 11a and 11 are electrically connected with each other. Note that secondary electrodes 11a and 11 may be formed integrally.

Since other configurations are the same as those in the first embodiment, their redundant explanations are omitted.

Next, functions of the optical voltage transformer according to the present embodiment configured as above will be explained.

Basically, the functions of the optical voltage transformer in the present embodiment configured are the same as those of optical voltage transformer in the first embodiment. However, since the secondary electrode 11a electrically connected with the secondary electrode 11 is embedded in the insulation layer 3 to surround the cavity 12, capacitances are ensured between the secondary electrode 11a and the ground layers 6 on the outer circumference of the insulation layer 3 and on the inner surface of the cavity 12 and thereby the larger ground-side capacitance can be secured.

Since the ground-side capacitance against the capacitance of the electro-optic element 2 can be made larger, the ground-side capacitance is not affected by temperature change and humidity change. As a result, the external measurement circuit can measure the measured voltage applied to the primary electrode 5 with high accuracy.

Since other functions are the same as those in the first embodiment, their redundant explanations are omitted.

According to the optical voltage transformer in the present embodiment, in addition to the advantages achieved in the above-explained first embodiment, since the larger ground-side capacitance can be secured, the flexibility for controlling the ground-side capacitance can be further expanded and thereby the electrical field of the electro-optic element 2 can be controlled effectively.

In addition, since the ground-side capacitance can be made larger in relation to the capacitance of the electro-optic element 2, the ground-side capacitance is not affected by temperature change and humidity change. As a result, the external measurement circuit can measure the measured voltage applied to the primary electrode 5 with high accuracy.

Figure 3:
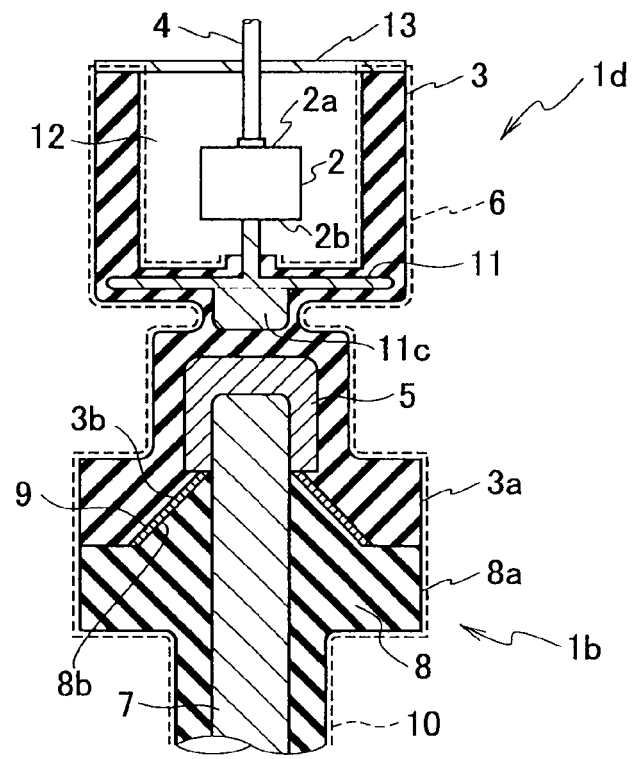
[FIG. 3] It is a cross-sectional drawing showing an optical voltage transformer according to a third embodiment of the present invention.

Next, an optical voltage transformer according to a third embodiment will be explained with reference to FIG. 3. As shown in FIG. 3, a presence of a secondary electrode 11c is different from the above-explained first embodiment.

The secondary electrode (boss) 11c is formed on an opposite face of the secondary electrode 11 to the primary electrode 5. The secondary electrode 11c is projected from the center of the disk-shaped secondary electrode 11. Therefore, the secondary electrodes 11c and 11 are electrically connected with each other.

In addition, a constriction is formed around the secondary electrode 11c on the insulation cylinder constructed by the insulation layer 3.

Since other configurations are the same as those in the first embodiment, their redundant explanations are omitted.

Next, functions of the optical voltage transformer according to the present embodiment configured as above will be explained.

Basically, the functions of the optical voltage transformer in the present embodiment configured are the same as those of optical voltage transformer in the first embodiment. However, formed is the constriction that surrounds the secondary electrode 11c electrically connected with the secondary electrode 11. Since the ground layer 6 is provided on the outer circumference of the insulation cylinder that includes the constriction, secured are the capacitance between the ground layer 6 in the constriction and the secondary electrode 11c and also the capacitance between the ground layer 6 in the constriction and the secondary electrode 11. Therefore, the larger ground-side capacitance can be secured.

Since the ground-side capacitance against the capacitance of the electro-optic element 2 can be made larger, the ground-side capacitance is not affected by temperature change and humidity change. As a result, the external measurement circuit can measure the measured voltage applied to the primary electrode 5 with high accuracy.

Since other functions are the same as those in the first embodiment, their redundant explanations are omitted.

According to the optical voltage transformer in the present embodiment, in addition to the advantages achieved in the above-explained first embodiment, since the larger ground-side capacitance can be secured, the flexibility for controlling the ground-side capacitance can be further expanded and thereby the electrical field of the electro-optic element 2 can be controlled effectively.

In addition, since the ground-side capacitance can be made larger in relation to the capacitance of the electro-optic element 2, the ground-side capacitance is not affected by temperature change and humidity change. As a result, the external measurement circuit can measure the measured voltage applied to the primary electrode 5 with high accuracy.

Figure 4:
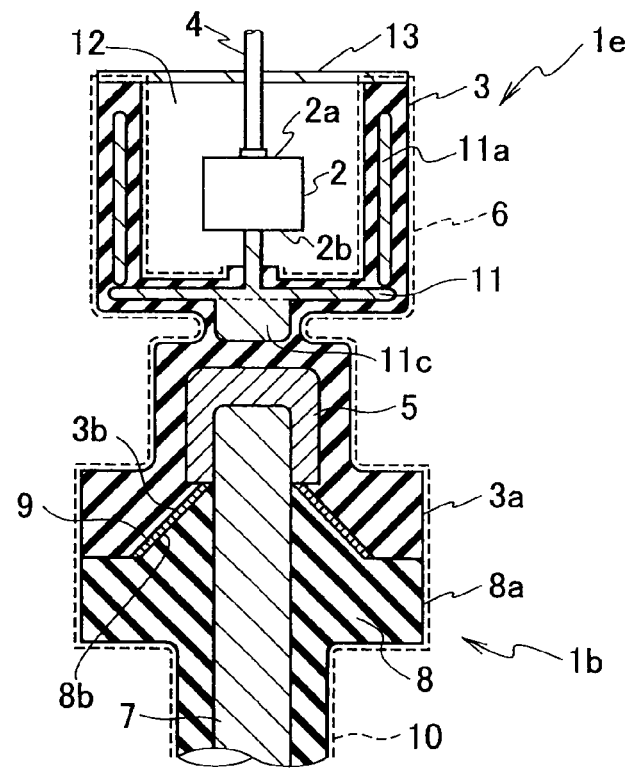
[FIG. 4] It is a cross-sectional drawing showing an optical voltage transformer according to a fourth embodiment of the present invention.

Next, an optical voltage transformer according to a fourth embodiment will be explained with reference to FIG. 4. As shown in FIG. 4, the voltage detector 1e in the present embodiment includes the secondary electrode 11a shown in the second embodiment and the secondary electrode 11c shown in the third embodiment. In addition, the constriction surrounding the secondary electrode 11c shown in the third embodiment is also formed. Therefore, according to the optical voltage transformer in the present embodiment, advantages by the secondary electrodes 11a and 11c can be also achieved in addition to the advantages achieved in the above-explained first embodiment.

INDUSTRIAL APPLICABILITY

The optical voltage transformer according to the present invention can be applied for measuring main circuit voltage in an electric device, such as a switchgear, using an electro-optic effect (Pockels effect).

The invention claimed is:

1. An optical voltage transformer comprising:
   a primary electrode connected with an external electric device, to which a measured voltage is applied by the external electric device;
   a first secondary electrode provided oppositely to the primary electrode;
   an insulation layer that is provided between the primary electrode and the first secondary electrode and constitutes an insulation cylinder integrally formed with the primary electrode and the first secondary electrode;
   a ground layer that is provided on an outer circumference of the insulation cylinder and around the first secondary electrode and secures a capacitance by interposing the insulation layer between the ground layer and the first secondary electrode; and
   an electro-optic element for measuring a voltage between the first secondary electrode and the ground layer.

2. The optical voltage transformer according to claim 1, wherein
   an opening connected with the electric device is formed in the insulation cylinder,
   the insulation layer is made of epoxy resign, and the insulation layer exposed at the opening is closely contacted with an insulation layer of the electric device with interposing a soft insulator therebetween when the electric device is connected with the opening.

3. The optical voltage transformer according to claim 1, wherein
   the insulation layer is made of a soft insulator.

4. The optical voltage transformer according to claim 1, wherein
   the insulation cylinder includes a sealed cavity that houses the electro-optic element.

5. The optical voltage transformer according to claim 4, wherein
   the ground layer is further provided on an inner surface of the cavity.

6. The optical voltage transformer according to claim 4, further comprises
   a second secondary electrode that is embedded in the insulation layer and surrounds the cavity, wherein
   the first secondary electrode and the second secondary electrode are electrically connected with each other.

7. The optical voltage transformer according to claim 1, wherein
   the first secondary electrode includes a boss on an opposite face thereof to the primary electrode.

* * * * *